United States Patent [19]
Nishimura et al.

[11] Patent Number: 5,400,024
[45] Date of Patent: Mar. 21, 1995

[54] DIGITAL SIGNAL PROCESSING APPARATUS FOR CONVERTING A DIGITAL SIGNAL FROM ONE TRANSMISSION RATE TO ANOTHER TRANSMISSION RATE

[75] Inventors: Satoru Nishimura; Niro Imaoka; Masahiro Narita, all of Gifu, Japan

[73] Assignee: Sanyo Electric Co., Ltd., Osaka, Japan

[21] Appl. No.: 21,325

[22] Filed: Feb. 23, 1993

[30] Foreign Application Priority Data

Feb. 25, 1992 [JP] Japan .................................. 4-037763

[51] Int. Cl.$^6$ ........................ H03M 7/42; H03M 5/00
[52] U.S. Cl. ..................................... 341/61; 341/141; 341/106
[58] Field of Search .................... 341/61, 106, 50, 141

[56] References Cited
U.S. PATENT DOCUMENTS 3,860,908  1/1975  Stratton, III .
4,536,745  8/1985  Yamaguchi et al. .
4,628,297  12/1986  Mita et al. .
4,804,959  2/1989  Makansi et al. .................. 341/61 X
5,119,093  6/1992  Vogt et al. ........................ 341/61 X

OTHER PUBLICATIONS

"Design Concept of Speech Processing Equipment for Digital Land Mobile Communication System", 2-411 of National Conference of IECE, Spring 1991.

Primary Examiner—Sharon D. Logan
Attorney, Agent, or Firm—Peter L. Michaelson

[57] ABSTRACT

Base station equipment of a digital mobile communication system includes a digital audio signal processing apparatus provided for each message channel for low bit rate coding and decoding a digital audio signal. Each digital audio signal processing apparatus includes a plurality of memories that store a plurality of low bit rate coding/decoding programs differing from each other to comply with different low bit rate coding/decoding methods. A system control circuit determines the low bit rate coding/decoding method of an applied digital signal for controlling a selector to select a memory that stores the corresponding low bit rate coding/decoding program. As a result, the digital audio signal processing apparatus perform digital to digital conversion of the applied digital signal according to the low bit rate coding/decoding program stored in the selected memory.

6 Claims, 6 Drawing Sheets

DIGITAL SIGNAL PROCESSING APPARATUS FOR CONVERTING A DIGITAL SIGNAL FROM ONE TRANSMISSION RATE TO ANOTHER TRANSMISSION RATE

BACKGROUND OF THE INVENTION

1. Field of the Invention

The present invention relates to a digital signal processing apparatus and a communication system using the same, and more particularly, to a digital signal processing apparatus that can comply with a plurality of different low bit rate coding methods, and a communication system using the same.

2. Description of the Background Art

Recently, the development of a digital mobile communication system employing a digital data transmission method, such as automobile telephone systems and portable telephone systems, is in progress in Japan, the United States, and Europe. In such a digital mobile communication system, the transmission rate is improved by transmitting a digital audio signal that is encoded in a low bit rate manner between either a base station connected to a public telephone line or an ISDN line and each terminal equipment coupled to the base station via a radio communication line.

For example, in accordance with the standard of Japanese digital automobile telephone system, the data transmission efficiency between the base station and each terminal equipment is improved by low bit rate coding (digital to digital converting) a digital signal having a transmission rate of 64 kbps into a digital signal having a transmission rate of 11.2 kbps using VSELP (Vector Sum Excited Linear Prediction) technique. In order to realize such data transmission, a digital audio signal processing apparatus is provided at both the base station side and at each terminal equipment side for low bit rate coding a digital audio signal that is to be transmitted, and for decoding a received low bit rate encoded digital audio signal.

Figure 1:
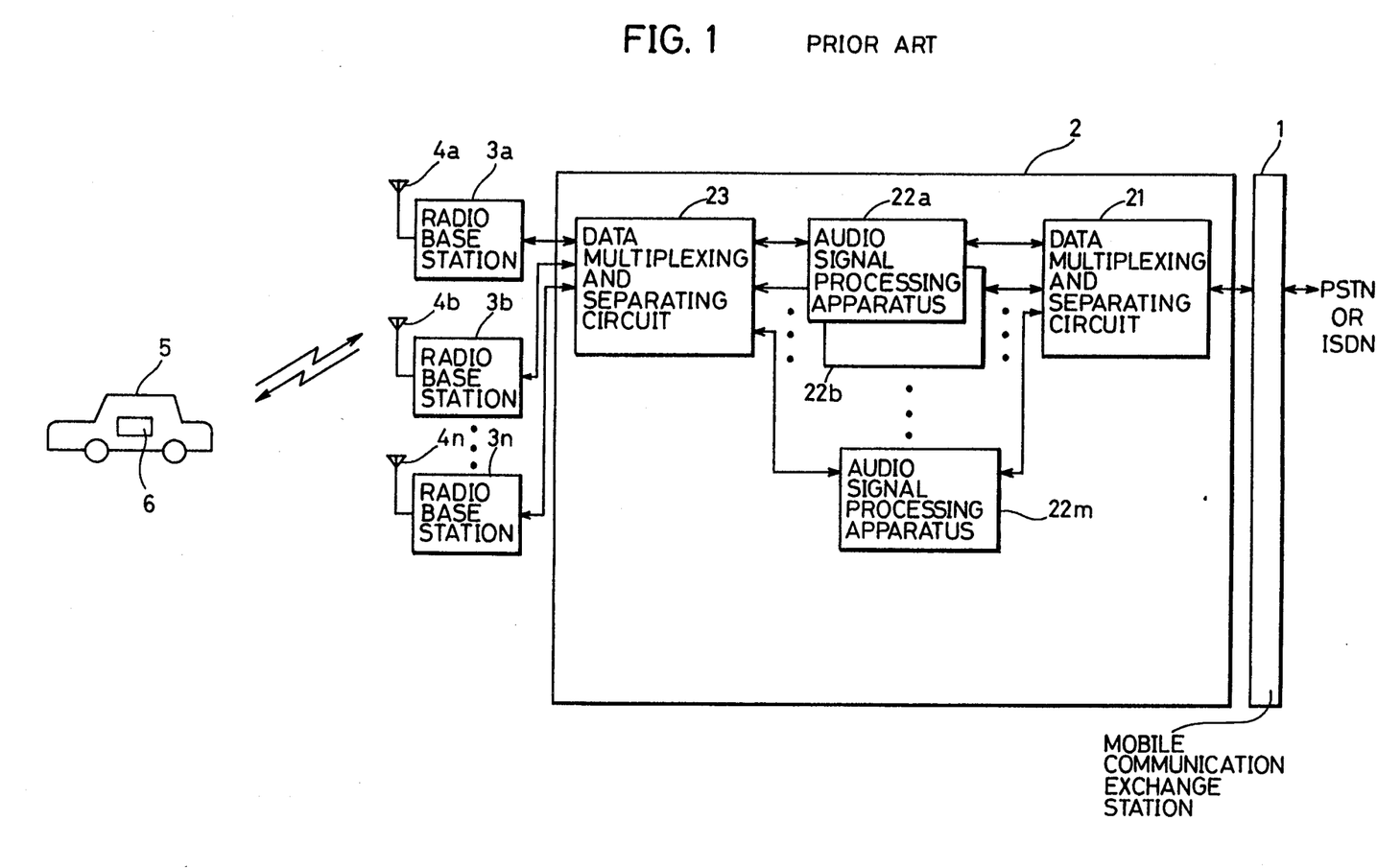
FIG. 1 is a block diagram of a structure of an audio signal processing section of a conventional digital mobile communication system.

FIG. 1 is a block diagram schematically showing the structure of an audio processing section of a cellular automobile telephone system using the above mentioned VSELP technique as an example of a digital mobile communication system. Transmission from a base station side to the terminal equipment side will be described with reference to FIG. 1. A μ-law PCM signal of 64 kbps as a digital audio signal supplied from a public telephone line (PSTN) or an ISDN line is subjected to a predetermined multiplexing process by a mobile communication exchange station 1 to be provided to a radio communication line control station 2.

More specifically, this mobile communication exchange station 1 carries out exchange between a mobile communication network and a fixed communication network (PSTN or ISDN) or another mobile communication network. For that purpose, the mobile communication exchange station 1 controls a plurality of a radio communication line control stations 2. The mobile communication exchange station 1, which includes a home memory for storing location information as to each mobile terminal equipment, searches for a mobile location of each terminal equipment in response to calling from the fixed communication network by using the home memory and carries out exchange with the radio communication line control station 2 corresponding to the mobile location.

The communication between mobile communication exchange station 1 and each radio communication line control station 2 is carried out through a high speed digital line. If a digital line of 8 Mbps is used, for example, a plurality of message channels, each of which is formed of digital data of 64 kbps obtained by converting analog audio signal as well as control data, are multiplexed for communication.

Radio communication line control station 2 includes two data multiplexing and separating circuits 21 and 23, and m (m is a positive integer) digital audio signal processing apparatuses 22a, 22b, . . . , 22m provided in parallel according to the number of message channels between these circuits. Data multiplexing and separating circuit 21 separates the multiplexed 64 kbps digital audio signal supplied from mobile communication exchange station 1 for respective message channels to provide single corresponding demultiplexed 64 kbps digital audio signals to digital audio signal processing apparatuses 22a, 22b, . . . , 22m. Each of the digital audio signal processing apparatuses 22a, 22b, . . . , 22m carries out low bit rate coding of the applied 64 kbps digital audio signal of each channel into a 11.2 kbps digital audio signal (digital to digital conversion) to provide that 11.2 kbps low bit rate coded signal to data multiplexing and separating circuit 23. Data multiplexing and separating circuit 23 time-divisionally multiplexes the 11.2 kbps digital audio signals provided from the m digital audio signal processing apparatuses 22a, 22b, . . . , 22m to provide the result to n (n is a positive integer) radio base stations 3a, 3b, . . . , 3n.

In the case of a mobile communication system of the cellular method, the plurality of radio base stations 3a, 3b, . . . , 3n are individually provided in respective corresponding cells. Each of radio base stations 3a, 3b, . . . , 3n digitally modulates the time-division multiplexed digital audio signal and control data supplied from radio communication line control station 2 to transmit that multiplexed signal to a plurality of terminal equipment, that are currently moving in the corresponding cell, via corresponding one of antennas 4a, 4b, . . . , 4n.

As a result, a radio communication line shown by an arrow is established between a terminal equipment 6 installed in a automobile 5 that is moving in each cell and a corresponding radio base station (for example station 3b). Terminal equipment 6 contains a digital audio signal processing apparatus (not shown) equivalent to each of the above-described digital audio signal processing apparatuses 22a, 22b, . . . , 22m for digital-demodulating the time-division multiplexed digital signals supplied from a corresponding radio base station, e.g., station 3b, and then separating the digital audio signal of 11.2 kbps of the corresponding message channel and decoding (digital to digital converting) a resulting separated digital audio signal into a digital audio signal having the original transmission rate of 64 kbps.

The transmission from each terminal equipment to the base station will be described with reference to FIG. 1 hereinafter. A digital audio signal of 11.2 kbps, that is low bit rate encoded by the aforementioned digital audio signal processing apparatus not shown, is time-division multiplexed with the control data in the predetermined format to be digital-modulated and transmitted from terminal equipment 6 side. A radio communication line indicated by an arrow is established between the terminal equipment 6 and a radio base station (for example station 3b) corresponding to the cell in which terminal equipment 6 is moving. Radio base station 3b receives digital signals from a plurality of terminal equipment in the cell via an antenna 4b to digital-demodulate the received signals. The demodulated digital audio signals and control data of a plurality of channels are multiplexed and then provided to radio communication line control station 2.

Digital multiplexing and separating circuit 23 in radio communication line control station 2 separates the digital audio signals of 11.2 kbps from the multiplexed data received from a plurality of radio base stations 3a, 3b, . . . , 3n for respective message channels to provide corresponding demultiplexed digital audio signals to digital audio signal processing apparatuses 22a, 22b, . . . , 22m. Each of digital audio signal processing apparatuses 22a, 22b, . . . , 22m decodes (digital to digital converts) the applied 11.2 kbps digital audio signal of each channel into a digital audio signal of 64 kbps to provide a resulting decoded digital signal to data multiplexing and separating circuit 21. Data multiplexing and separating circuit 21 multiplexes the 64 kbps digital audio signals provided from m digital audio signal processing apparatuses 22a, 22b, . . . , 22m provides the result to a public telephone line or an ISDN line via mobile communication exchange station 1.

Figure 2:
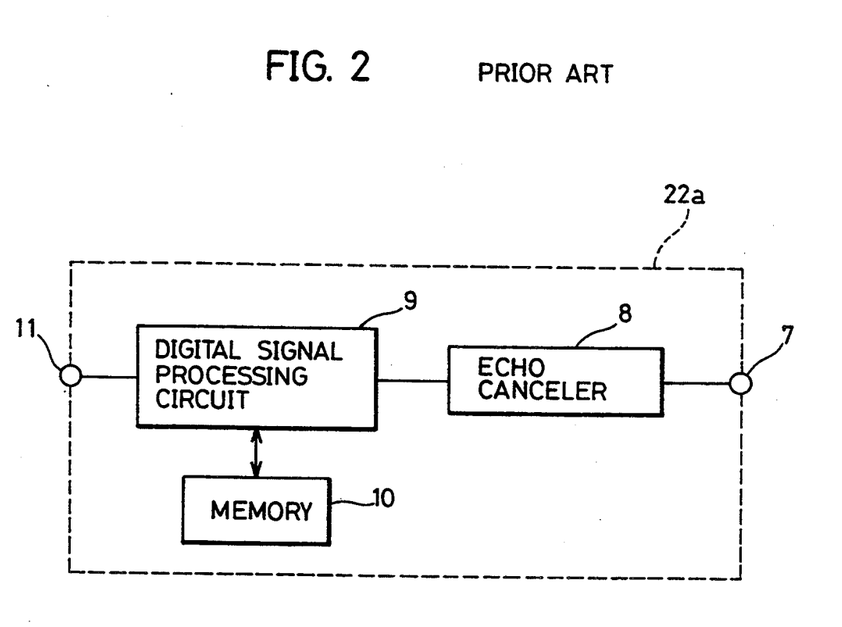
FIG. 2 is a block diagram schematically showing the structure of a conventional digital audio signal processing apparatus.

FIG. 2 is a block diagram schematically showing a structure of the digital audio signal processing apparatus 22a shown in FIG. 1. Each of the remaining digital audio signal processing apparatus 22b, . . . , 22m has the same structure as that of this digital audio signal processing apparatus 22a, and their description will not be repeated.

At the time of transmission from the base station side, a digital audio signal of 64 kbps (μ-law PCM signal) provided from data multiplexing and separating circuit 21 of FIG. 1 is applied to an echo canceler 8 via a terminal 7. Echo canceler 8 removes the echo components in the digital audio signal generated at a 2 line-4 line conversion unit (well known and not shown) included in the public telephone line network. The digital audio signal provided from echo canceler 8 is supplied to a well known digital signal processing circuit (high speed DSP) 9 such as MOTOROLA DSP56116 for converting a digital audio signal having a transmission rate of 64 kbps and a digital audio signal having a transmission rate of 11.2 kbps to each other. A signal processing program for digital to digital conversion by the VSELP technique is stored in a memory (ROM) 10 to be executed by digital signal processing circuit 9. Digital signal processing circuit 9 converts (low bit rate encodes) a digital audio signal of 64 kbps to a digital audio signal of 11.2 kbps in accordance with the program stored in memory 10 to provide the obtained signal to data multiplexing and separating circuit 23 (FIG. 1) via a terminal 11. In the apparatus of FIG. 2, each of terminals 7 and 11 is shared for input and output for simplification of description.

At a time of reception at the base station side, digital signal processing circuit 9 converts (decodes) a digital audio signal of 11.2 kbps supplied from data multiplexing and separating circuit 23 of FIG. 1 into a digital audio signal of 64 kbps in accordance with the program stored in memory 10 to provide the obtained signal to data multiplexing and separating circuit 21 (FIG. 1) via echo canceler 8 and terminal 7. The above-described digital mobile communication system is disclosed in, for example, "Design Concept of Speech Processing Equipment for Digital Land Mobile Communication Systems" 2-411 of National Conference of IECE, Spring 1991.

Although highly efficient data transmission can be carried out in the above-described digital mobile communication system of VSELP method by low bit rate coding a digital audio signal into a transmission rate of 11.2 kbps, there may be a case where the transmission rate is further reduced and the number of communication slots increased to further improve the transmission rate. More specifically, a low bit rate coding method employing a different transmission rate other than the low bit rate coding method employing the aforementioned transmission rate of 11.2 kbps can be considered.

For example, the low bit rate coding using the transmission rate of 11.2 kbps (full rate) has been adopted by the current standard of the digital cellular system, so that signals of three channels are multiplexed to be transmitted through the radio communication line having the transmission rate of 42 kbps. On the other hand, there is a plan of further reducing the transmission rate to 5.6 kbps (half rate) in the future, so that six channels can be multiplexed at the maximum.

Therefore, during the period for changing from full rate to half rate, there may be a case where digital audio signals by low bit rate coding methods of a plurality of different transmission rates are mixed in one digital mobile communication system. In such a case, a plurality of digital audio signal processing apparatus (for example, 22a, 22b, . . . , 22m of FIG. 1) must be provided for each low bit rate coding method, i.e. for each transmission rate, resulting in significant increase in the size of the apparatus at the base station. Furthermore, the manufacturing cost will increase.

It is often difficult from the standpoint of structure to add a digital audio signal processing apparatus corresponding to a low bit rate coding method of a different transmission rate after provision of a digital audio signal processing apparatus corresponding to a low bit rate coding method of the transmission rate of 11.2 kbps, for example, in the base station, and there is a possibility of the original communication service being interrupted in the worst case.

SUMMARY OF THE INVENTION

In view of the foregoing, an object of the present invention is to provide a digital signal processing apparatus that can comply with a plurality of different low bit rate coding methods without increase in the size and manufacturing cost of the apparatus and a communication system using the same.

A digital signal processing apparatus according to the present invention includes a digital signal processing circuit for converting, on a digital-to-digital basis, an applied digital signal into a digital signal of a different transmission rate according to a given low bit rate coding/decoding program, a plurality of memories for respectively storing a plurality of low bit rate coding/decoding programs different from each other, a system control circuit for determinating the low bit rate coding/decoding method of the applied digital signal to control the digital signal processing circuit based on the result of the determination, and a selector for selecting a memory, out of the plurality of memories, that stores the low bit rate coding/decoding program corresponding to the low bit rate coding/decoding method determined by the system control circuit, wherein the digital signal processing circuit carries out digital to digital conversion according to the low bit rate coding/decoding program stored in the memory selected by the selector.

According to another aspect of the present invention, the digital signal processing apparatus includes a digital signal processing circuit for digital to digital converting an applied digital signal into a digital signal of a different transmission rate according to a given low bit rate coding/decoding program, a plurality of memories for respectively storing a plurality of low bit rate coding/decoding programs different from each other, a RAM for temporarily storing any of the plurality of low bit rate coding/decoding programs, and a system control circuit for determining the low bit rate coding/decoding method of the applied digital signal to select a memory storing the low bit rate coding/decoding program corresponding to the determined low bit rate coding/decoding method out of the plurality of memories and to transfer the low bit rate coding/decoding program stored therein to the RAM, wherein the digital signal processing circuit carries out digital to digital conversion according to the low bit rate coding/decoding program transferred to and stored in the RAM.

According to the further aspect of the present invention, a communication system includes base station equipment connected to a public telephone line, and terminal equipment coupled to the base station equipment via a radio communication line. Specifically, the base station equipment includes a first digital signal processing circuit corresponding to each message channel. The first digital signal processing circuit converts a digital signal provided from the public telephone line or the terminal equipment into a digital signal of a different transmission rate according to a given low bit rate coding/decoding program. The base station also includes plurality of memories for respectively storing a plurality of low bit rate coding/decoding programs different from each other, a system control circuit for determining the low bit rate coding/decoding method of the applied digital signal to control the digital signal processing circuit based on the result of the determination, and a selector for selecting, from the plurality of memories, that stores the low bit rate coding/decoding program corresponding to the low bit rate coding/decoding method determined by the system control circuit. The base station digital signal processing circuit converts, on a digital-to-digital basis, conversion according to the low bit rate coding/decoding program stored in the memory selected by the selector. The terminal equipment includes a second digital signal processing circuit for converting, also on a digital-to-digital basis, a digital signal received from or to be transmitted to the base station into a digital signal of a different transmission rate.

According to still another aspect of the present invention, a communication system includes base station equipment connected to a public telephone line, and at least one terminal equipment coupled to the base station equipment via a radio communication line. Specifically the separate first equipment includes a base station digital signal processing circuit corresponding to each message channel. For each such channel, its associated first digital signal processing circuit converts, on a digital-to-digital basis, a digital signal applied from the public telephone line or the terminal side equipment into a digital signal of a different transmission rate according to a given low bit rate coding/decoding program. The base station equipment also includes a plurality of memories for respectively storing a plurality of low bit rate coding/decoding programs different from each other, a RAM for temporarily storing any of the plurality of low bit rate coding/decoding programs, and a system control circuit for determining the low bit rate coding/decoding method of the applied digital signal so as to select a memory, out of the plurality of memories, that stores the low bit rate coding/decoding program corresponding to the determined low bit rate coding/decoding method and for transferring the low bit rate coding/decoding program stored therein to the RAM within appropriate ones of the channels, within each channel the digital signal processing circuit then converts on a digital-to-digital basis, the applied digital signal according to the low bit rate coding/decoding program transferred to and stored in the RAM therein. The terminal side equipment also includes a second digital signal processing circuit for converting, on a digital-to-digital basis, a digital signal received from or to be transmitted to the base station equipment into a digital signal of a different transmission rate according to the low bit rate coding/decoding program.

The main advantage of the present invention is that low bit rate coding and decoding of a digital signal can be carried out reliably even when a plurality of digital signals to be coded in different low bit rate coding methods are mixed and provided because the low bit rate coding method of the supplied digital signal is detected and a memory storing a digital to digital conversion program corresponding to the detection result is selected.

Another advantage of the present invention is that the manufacturing cost can be further reduced because a minimum number of memories for storing different low bit rate coding/decoding programs are provided corresponding to the number of the low bit rate coding methods and one RAM is used as the memory for temporarily storing the corresponding program in the digital signal processing apparatus of each channel.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
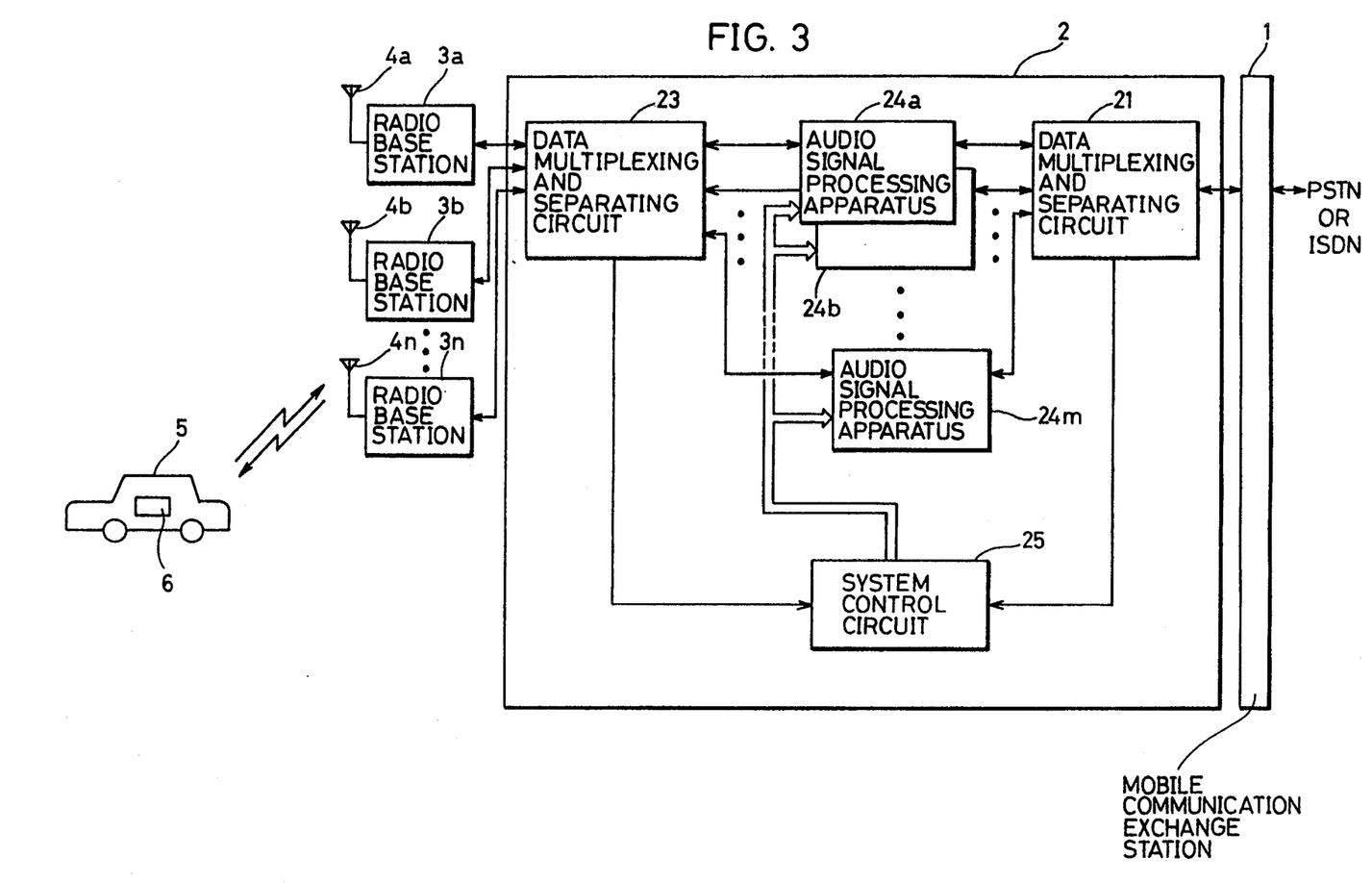
FIG. 3 is a block diagram showing a structure of an audio signal processing section of a digital mobile communication system according to a first embodiment of the present invention.
Figure 4:
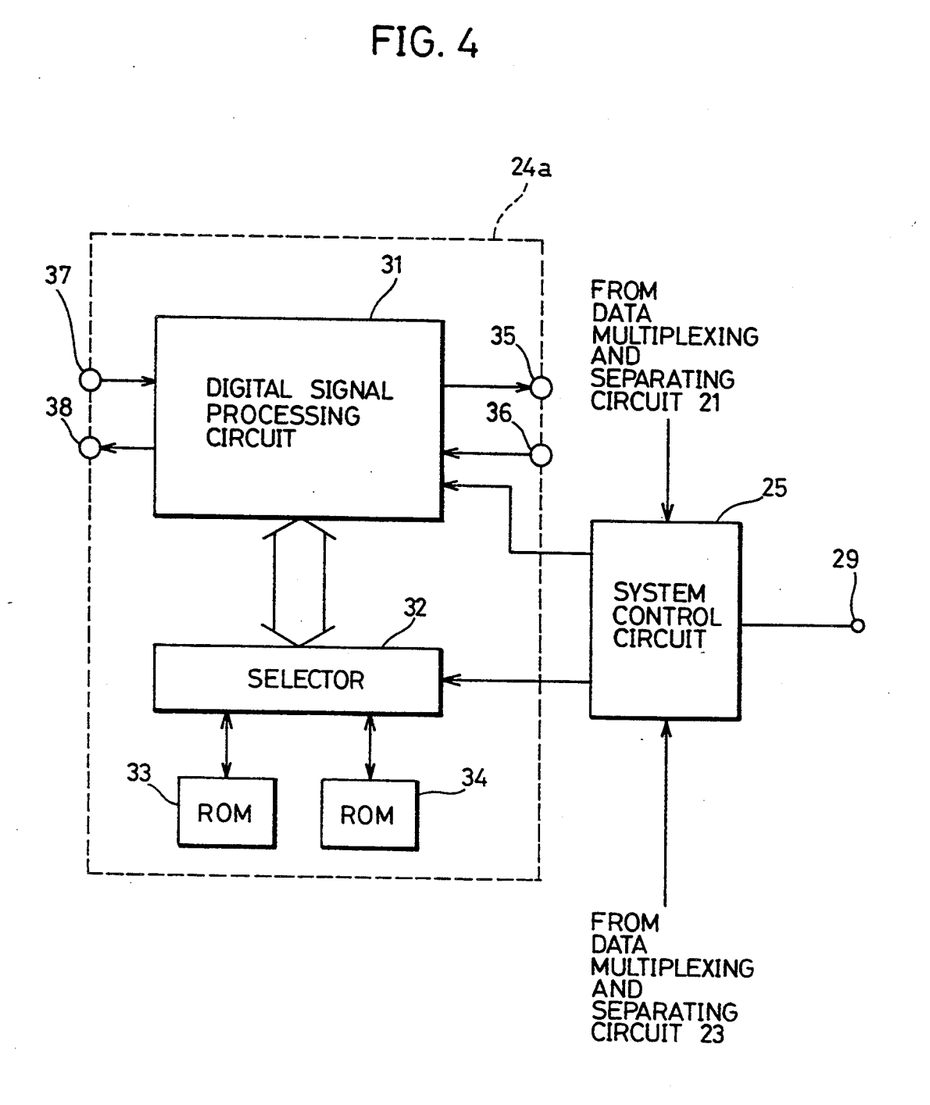
FIG. 4 is a block diagram showing a digital audio signal processing apparatus according to a first embodiment of the present invention.

FIG. 3 is a block diagram showing a structure of an audio signal processing section of a digital mobile communication system according to a first embodiment of the present invention. The first embodiment of FIG. 3 is the same as the conventional digital communication system of FIG. 1 except for the points that will be described in the following, and description of common sections will not be repeated. More specifically, digital audio signal processing apparatuses 24a, 24b, ..., 24m are provided instead of digital audio signal processing apparatuses 22a, 22b, ..., 22m of FIG. 1. FIG. 4 shows the structure of a digital audio signal processing apparatus 24a as an example. Referring to FIG. 3 again, a system control circuit 25 is provided in radio communication line control station 2 for receiving signals from data multiplexing and separating circuits 21 and 23 and controlling the operation of digital audio signal processing apparatuses 24a, 24b, ..., 24m.

The details of the first embodiment of the present invention will be described with reference to FIGS. 3 and 4. In FIG. 4, for simplification of the illustration, the echo canceler is omitted. Referring to FIG. 4, each of digital audio signal processing apparatuses 24a, 24b, ..., 24m includes a digital signal processing circuit 31. Digital signal processing circuit 31 receives a digital audio signal of 64 kbps ($\mu$-law PCM signal) from data multiplexing and separating circuit 21 (FIG. 3) via an input terminal 36 to low bit rate encode that signal. A resulting encoded signal is provided to data multiplexing and separating circuit 23 (FIG. 3) via an output terminal 38. At the time of reception, digital signal processing circuit 31 receives a low bit rate encoded digital audio signal from data multiplexing and separating circuit 23 via input terminal 37 to decode that signal into a digital audio signal of 64 kbps. This decoded signal is provided to data multiplexing and separating circuit 21 via output terminal 35.

Memories (ROM) 33 and 34 store signal processing programs for digital to digital conversion of transmission rates different from each other that can be executed in digital signal processing circuit 31. For example, similar to memory 10 of FIG. 2, memory 33 stores a program for executing an algorithm and processing routine for low bit rate coding method by the VSELP technique. Memory 34 stores a different program for executing an algorithm and a processing routine for a low bit rate coding method having a transmission rate lower than that of the VSELP method. The program read out from either memory 33 or 34 is selectively supplied to digital signal processing circuit 31 via a selector 32 which is switching-controlled in accordance with an output of system control circuit 25.

System control circuit 25 detects the low bit rate coding method of a digital audio signal to be digital to digital converted by digital signal processing circuit 31 for each message channel in response to a signal from data multiplexing and separating circuit 21 at the time of transmission and a signal from data multiplexing and separating circuit 23 at the time of reception. Control signals, such as a mode designating signal and various timing signals are provided to digital signal, processing circuit 31 for each digital audio, signal processing apparatus. Also, a switching control signal is supplied to the control input of selector 32. The detection of a coding method for each message channel can be carried out by detecting the terminal equipment type information included in the control signal by system control circuit 25 in receiving the control signals according to the standards such as CCIR and CCITT prior to the establishment of each message channel, for example. The detection of a low bit rate coding method is not limited to this and may be carried out at any other circuit portion.

When determination is made by system control circuit 25 that the low bit rate coding method that should be processed at digital signal processing circuit 31 of a certain message channel is the VSELP method, system control circuit 25 supplies various control signals to the digital signal processing circuit 31 of the corresponding message channel and a switching control signal to selector 32 for selecting the output of memory 33. Selector 32 responds to this switching control signal to select the program stored in memory 33 to provide this program to digital signal processing circuit 31.

Digital signal processing circuit 31 low bit rate encodes a digital audio signal of 64 kbps provided from input terminal 36 into a digital audio signal of 11.2 kbps according to this program to provide the same via output terminal 38 at the time of transmission. Digital signal processing circuit 31 decodes the low bit rate encoded digital audio signal of 11.2 kbps provided from input terminal 37 into a digital audio signal of 64 kbps according to this program at the time of reception. The decoded signal is then provided as output, via output terminal 35.

When determination is made by system control circuit 25 that the low bit rate coding method to be processed by digital signal processing circuit 31 of a certain message channel is a method having a transmission rate lower than that of the VSELP method, system control circuit 25 supplies various control signals to the digital signal processing circuit 31 of the corresponding message channel and a switching control signal to selector 32 for selecting the output of memory 34. Selector 32 responds to this switching control signal to select the program stored in memory 34 to provide this program to digital signal processing circuit 31.

Therefore, digital signal processing circuit 31 low bit rate encodes a digital audio signal of 64 kbps provided from input terminal 36 into a digital audio signal of a transmission rate lower than 11.2 kbps according to this program at the time of transmission. The encoded signal is then provided as output, via output terminal 38. Digital signal processing circuit 31 decodes a low bit rate encoded digital audio signal of a transmission rate lower than 11.2 kbps from input terminal 37 into a digital audio signal of 64 kbps according to this program at the time of reception. The decoded signal is output via output terminal 35.

Thus, according to the first embodiment of the present invention, the low bit rate coding method of a supplied digital audio signal is detected, whereby a memory storing a digital to digital conversion program corresponding to the detection result is selected. Therefore, low bit rate coding and decoding of a digital audio signal can reliably be carried out even in the case where a mixture of a plurality of digital audio signals to be decoded by different coding methods are provided.

Figure 5:
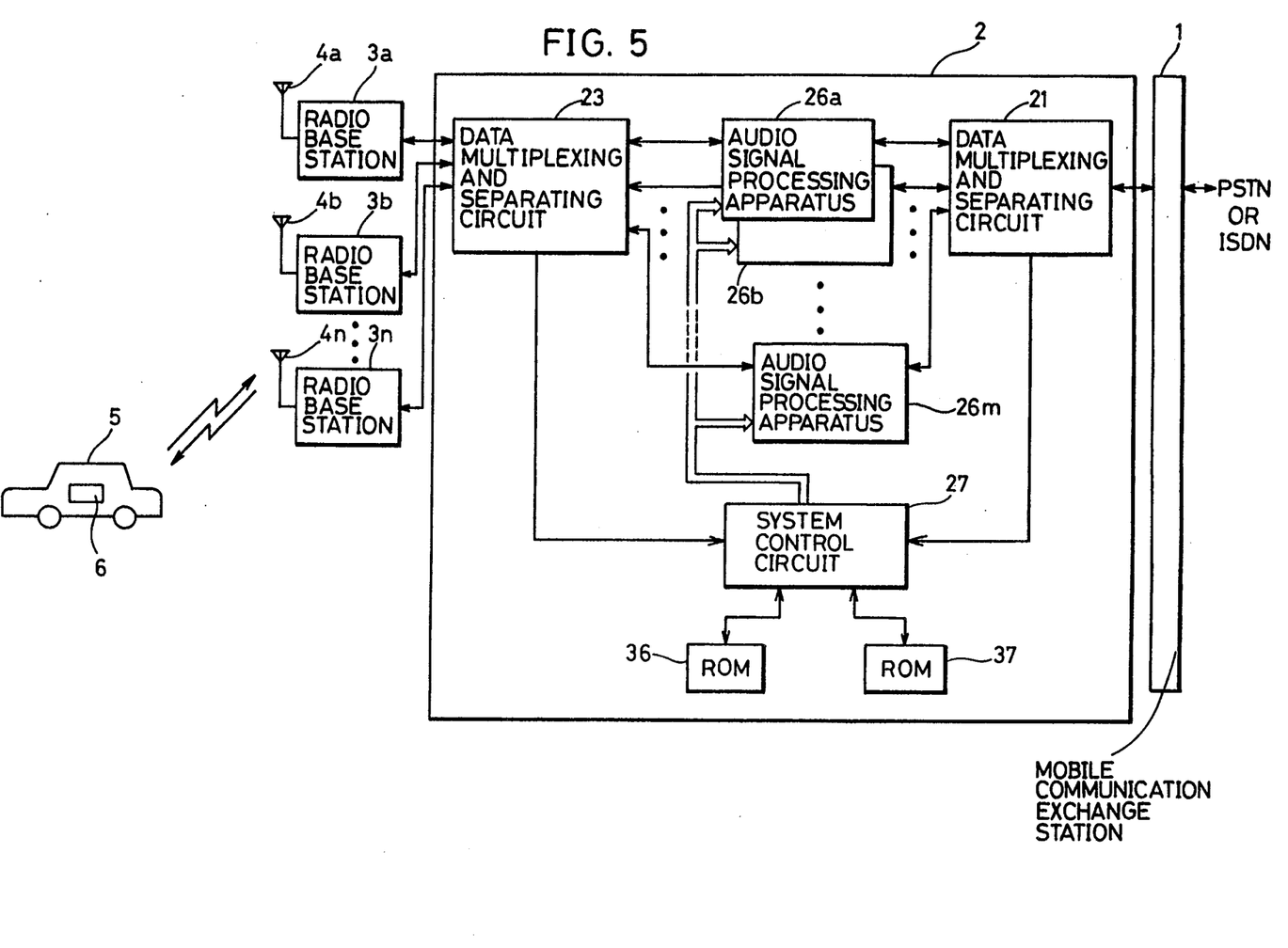
FIG. 5 is a block diagram showing a structure of an audio signal processing section of a digital mobile communication system according to a second embodiment of the present invention.
Figure 6:
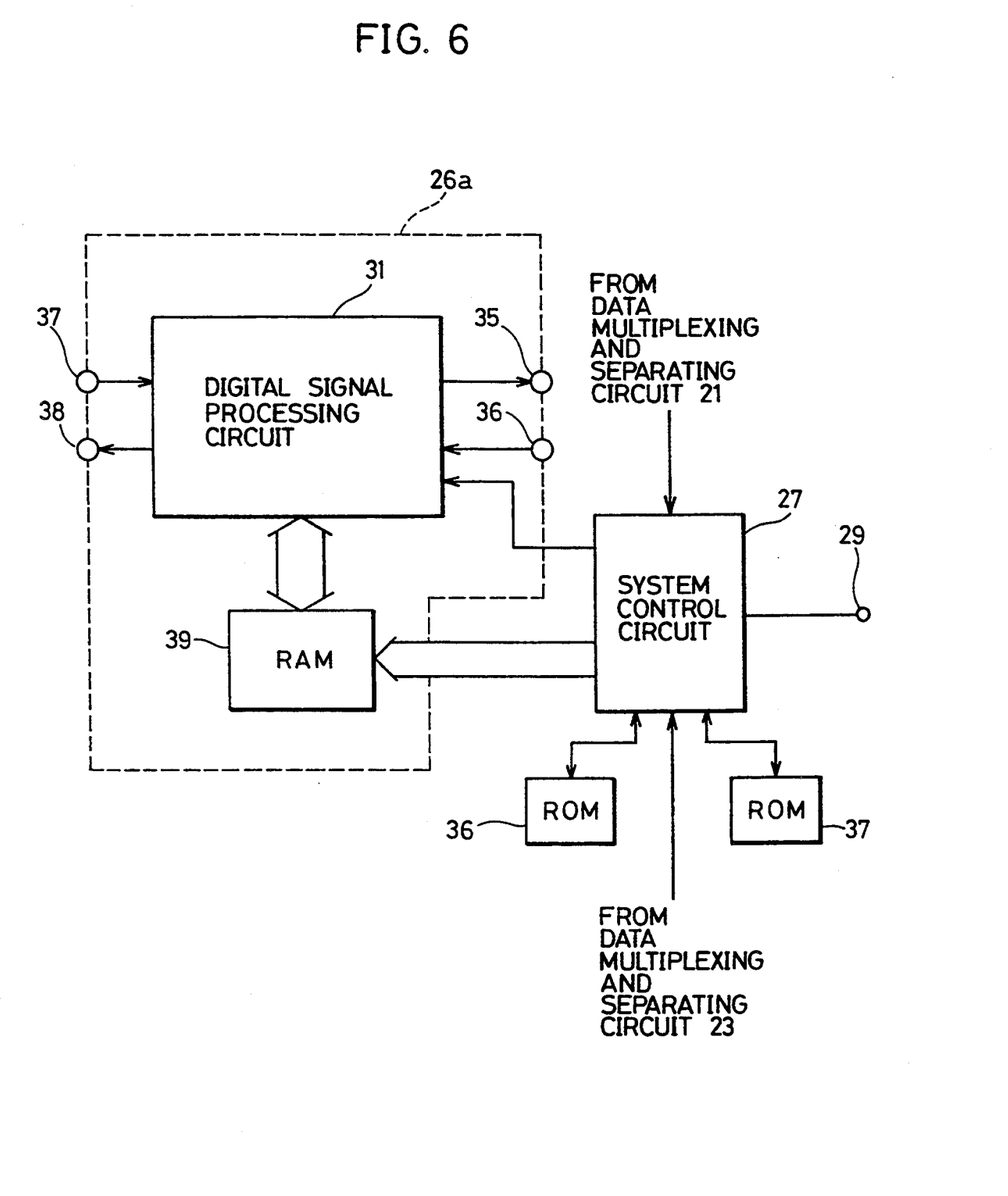
FIG. 6 is a block diagram showing a digital audio signal processing apparatus according a second embodiment of the present invention.

FIG. 5 is a block diagram showing a structure of an audio processing section of a digital mobile communication system according to a second embodiment of the present invention. The second embodiment of FIG. 5 is the same as the first embodiment of FIG. 3 except for the points that will be described in the following, and description of the common sections will not be repeated. More specifically, digital audio signal processing apparatuses 26a, 26b, . . . , 26m are provided instead of digital audio signal processing apparatuses 24a, 24b, . . . , 24m of FIG. 3. FIG. 6 shows a structure of a digital audio signal processing apparatus 26a as an example. Referring to FIGS. 5 and 6, a system control circuit 27 receive signals from data multiplexing and separating circuits 21 and 23 for detecting the low bit rate coding method of a digital audio signal to be digital to digital converted by digital signal processing circuit 31 for each message channel.

Signal processing programs for carrying out digital to digital conversion of different transmission rates executable in digital signal processing circuit 31 are stored in read only memories (ROM) 36 and 37. Similar to memory 33 of FIG. 4, memory 36, for example, stores programs for executing an algorithm and a processing routine for a low bit rate coding method of the VSELP technique. Similar to memory 34 of FIG. 4, memory 37 stores a different program for executing an algorithm and a processing routine for a low bit rate coding method of a transmission rate lower than the VSELP method. The program read out from either memory 36 or 37 is selectively supplied to memory (RAM) 39 for temporary storage by system control circuit 27.

When determination is made by system control circuit 27 that the low bit rate coding method to be processed by digital signal processing circuit 31 of a certain message channel is the VSELP method, system control circuit 27 applies control signals, such as a mode designating signal and various timing signals, to the digital signal processing circuit 31 of the corresponding channel, and transfers the program stored in memory (ROM) 36 to memory (RAM) 39.

Therefore, digital signal processing circuit 31 low bit rate encodes a digital signal of 64 kbps supplied from input terminal 36 into a digital audio signal of 11.2 kbps according to the program stored in memory (RAM) 39 at the time of transmission. The encoded signal is output via output terminal 38. At the time of reception, digital signal processing circuit 31 decodes a low bit rate encoded digital audio signal of 11.2 kbps provided from input terminal 37 into a digital audio signal of 64 kbps according to the program stored in memory (RAM) 39. The decoded signal is then applied as output, via output terminal 35.

When determination is made by system control circuit 27 that the low bit rate coding method to be processed by digital signal processing circuit 31 of a certain message channel has a transmission rate lower than the VSELP method, system control circuit 27 supplies to the digital signal processing circuit 31 of the corresponding channel control signals, such as a mode designating signal and various timing signals, and transfers the program stored in memory (ROM) 37 to memory (RAM) 39.

Therefore, digital signal processing circuit 31 low bit rate encodes a digital audio signal of 64 kbps provided from input terminal 36 into a digital audio signal of a transmission rate lower than 11.2 kbps according to the program stored in memory (RAM) 39 at the time of transmission. The encoded signal is then applied as output, via output terminal 38. At the time of reception, digital signal processing circuit 31 decodes a low bit rate encoded digital audio signal having the transmission rate lower than 11.2 kbps provided from input terminal 37 into a digital audio signal of 64 kbps according to the program stored in memory (RAM) 39. The decoded signal is output via output terminal 35.

Thus, according to the second embodiment of the present invention, only the minimum required number of expensive memories (ROM) storing programs of different low bit rate coding methods are provided corresponding to the types of coding methods, and only one less expensive RAM is used as the memory for temporarily storing the program of the corresponding coding method in the digital audio signal processing apparatus of each message channel. Therefore, the manufacturing cost can further be reduced in comparison with the first embodiment of FIG. 4 where two ROMs are used for each message channel.

Although the low bit rate coding method of a provided digital signal is determined by system control circuits 25 or 27 according to signals from data multiplexing and separating circuits 21 and 23 in the above-described embodiments, the present invention may be implemented so that a signal indicating a low bit rate coding method is directly supplied to system control circuits 25 or 27 via a terminal 29, as shown in FIGS. 4 and 6.

Although the above embodiments have been described in which the present invention is applied to a low bit rate coding of a digital audio signal in a digital mobile communication system, the present invention is applicable to other digital signals such as a video signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital signal processing apparatus comprising:
   signal processing means for converting on a digital-to-digital basis an applied digital signal occurring at a first transmission rate into a digital signal occurring at a second transmission rate according to a given low bit rate coding/decoding program, wherein said first and second transmission rates are different;
   a plurality of storage means for storing a corresponding plurality of low bit rate coding/decoding programs, each of said programs being different from each other;
   control means for determining a low bit rate coding/decoding method of said applied digital signal, and, in response to the method so determined, controlling said signal processing means; and
   selecting means, responsive to said control means, for selecting one of the plurality of storage means that stores one of the low bit rate coding/decoding programs corresponding to the low bit rate coding/decoding method determined by said control means; and
   wherein said signal processing means performs the digital to digital conversion according to the low bit rate coding/decoding program stored in the storage means selected by said selecting means.

2. The digital signal processing apparatus according to claim 1, wherein said control means comprises means for detecting the low bit rate coding/decoding method of said applied digital signal directly from said applied digital signal itself.

3. The digital signal processing apparatus according to claim 1, wherein said control means comprises means for receiving a signal indicating the low bit rate coding/decoding method of said applied digital signal separately from said applied digital signal itself.

4. A digital signal processing apparatus comprising:
signal processing means for converting on a digital-to-digital basis an applied digital signal occurring at a first transmission rate into a digital signal occurring at a second transmission rate according to a given low bit rate coding/decoding program, wherein said first and second transmission rates are different;
a plurality of storage means for storing a corresponding plurality of low bit rate coding/decoding programs, each of said programs being different from each other;
temporary storage means for temporarily storing any of said plurality of low bit rate coding/decoding programs; and
control means for determining a low bit rate coding/decoding method of said applied digital signal, and, in response to the method so determined, selecting one of the plurality of storage means that stores one of low bit rate coding/decoding programs corresponding to the determined low bit rate coding/decoding method and transferring the one low bit rate coding/decoding program stored therein to said temporary storage means; and
wherein said signal processing means performs the digital-to-digital conversion according to the low bit rate coding/decoding program transferred to said temporary storage means.

5. The digital signal processing apparatus according to claim 4, wherein said control means comprises means for detecting the low bit rate coding/decoding method of said applied digital signal directly from said applied digital signal itself.

6. The digital signal processing apparatus according to claim 4, wherein said control, means comprises means for receiving a signal indicating a low bit rate coding/decoding method of said applied digital signal separately from said applied digital signal itself.

* * * * *